US011544612B2

(12) United States Patent
Ashikhmin

(10) Patent No.: US 11,544,612 B2
(45) Date of Patent: Jan. 3, 2023

(54) MEMORY SYSTEM USING A QUANTUM CONVOLUTIONAL CODE

(71) Applicant: Nokia Technologies Oy, Espoo (FI)

(72) Inventor: Alexei Ashikhmin, Morristown, NJ (US)

(73) Assignee: Nokia Technologies Oy, Espoo (FI)

( * ) Notice: Subject to any disclaimer, the term of this patent is extended or adjusted under 35 U.S.C. 154(b) by 878 days.

(21) Appl. No.: 16/412,897

(22) Filed: May 15, 2019

(65) Prior Publication Data

US 2020/0364598 A1 Nov. 19, 2020

(51) Int. Cl.
*G06N 10/00* (2022.01)
*G06F 7/78* (2006.01)
*H03M 13/11* (2006.01)
*B82Y 10/00* (2011.01)

(52) U.S. Cl.
CPC .............. *G06N 10/00* (2019.01); *B82Y 10/00* (2013.01); *G06F 7/78* (2013.01); *H03M 13/1148* (2013.01)

(58) Field of Classification Search
CPC ........... G06N 10/00; B82Y 10/00; G06F 7/78; H03M 13/1148; H03M 13/611; H03M 13/23; H03M 13/235
See application file for complete search history.

(56) References Cited

U.S. PATENT DOCUMENTS

| 8,324,120 B2 | 12/2012 | Baldwin et al. |
| 8,633,092 B2 | 1/2014 | Baldwin et al. |
| 8,987,703 B2 | 3/2015 | Willett |
| 9,286,154 B2 | 3/2016 | Ashikhmin |
| 9,762,262 B2 | 9/2017 | Ashikhmin |
| 9,944,520 B2 | 4/2018 | Ashikhmin |
| 2018/0157986 A1 | 6/2018 | Oxford et al. |

FOREIGN PATENT DOCUMENTS

| WO | WO2018063139 A1 | 5/2018 |
| WO | WO2018125026 A1 | 7/2018 |

OTHER PUBLICATIONS

Gaitan, Frank, "Quantum Error Correction and Fault Tolerant Quantum Computing", Taylor & Francis, 2008.
Barenco, Adriano, et al. "Elementary gates for quantum computation." Physical review A 52.5 (1995): pp. 3457-3487.
(Continued)

*Primary Examiner* — Matthew L Reames
(74) *Attorney, Agent, or Firm* — Mendelsohn Dunleavy, P.C.; Steve Mendelsohn; Yuri Gruzdkov

(57) ABSTRACT

A memory system comprising a qubit array configured to store therein one or more entangled qubit states encoded using a quantum stabilizer code. The memory system further comprises a quantum-state-refresh module configured to refresh an entangled qubit state in the qubit array when a degradation error is detected therein. The quantum-state-refresh module is further configured to detect the degradation error by performing a redundant measurement of a set of syndrome values corresponding to the quantum stabilizer code. The redundant measurement is based on an error-correction code defined using the generator matrix of the quantum stabilizer code and a corresponding supplemental parity-check matrix. In an example embodiment, each of the generator and supplemental parity-check matrices has a respective inclined-stripe form.

13 Claims, 6 Drawing Sheets

(56) References Cited

OTHER PUBLICATIONS

Lin, Shu et al. "Error Control Coding: Fundamentals and Applications", 1st Edition, Prentice Hall, 1983.
Ashikhmin, Alexei et al., "Foundations of Quantum Error Correction," AMS/IP Studies in Advanced Mathematics, 41: Recent Trends in Coding Theory and its Applications, pp. 151-185, 2007.
Nielsen, Michael A et al., "Quantum Computation and Quantum Information." 10th Anniversary Edition, Cambridge, UK: Cambridge University Press, 2010.
Chen, Goong et al., "Quantum Computing Devices: Principles, Designs, and Analysis," CRC Press, 2007.

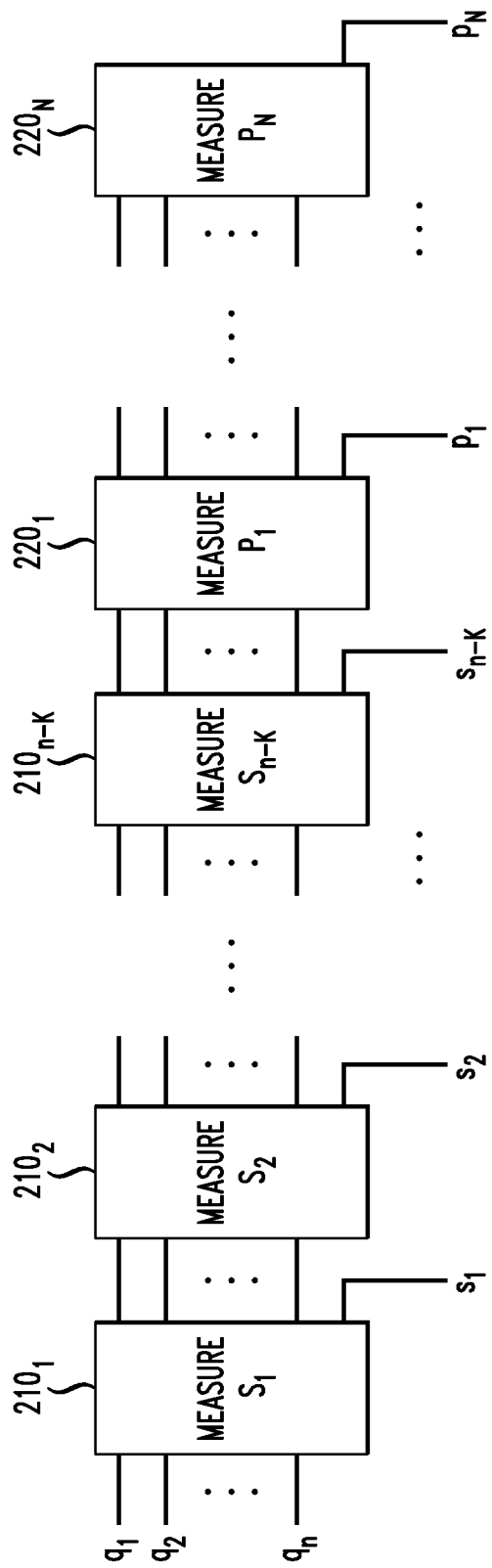

MEMORY SYSTEM USING A QUANTUM CONVOLUTIONAL CODE

BACKGROUND

Field

Various example embodiments relate to quantum computing and, more specifically but not exclusively, to a memory system for a quantum-computing device.

Description of the Related Art

This section introduces aspects that may help facilitate a better understanding of the disclosure. Accordingly, the statements of this section are to be read in this light and are not to be understood as admissions about what is in the prior art or what is not in the prior art.

Quantum-computing devices have been made or proposed based on various technologies, e.g., superconducting-junction devices, ion-trap devices, quantum-well devices, fractional-quantum-Hall-effect (FQHE) devices, etc. Quantum-computing devices typically use a quantum memory to store a state, and hardware for writing the state to the memory and for reading the state from the memory. Reliable methods for writing to the quantum memory and reading from the quantum memory are useful for various types of quantum-computing devices. Some quantum-computing applications rely on the quantum memory to store qubit states with sufficiently high fidelity for a relatively long time. However, a quantum state or ensemble of quantum states may exhibit a relatively high rate of loss of fidelity or degradation, e.g., due to decoherence, processing in quantum-gate devices, and/or transmission through quantum channels.

SUMMARY OF SOME SPECIFIC EMBODIMENTS

Disclosed herein are various embodiments of a memory system comprising a qubit array configured to store therein one or more entangled qubit states encoded using a quantum stabilizer code. The memory system further comprises a quantum-state-refresh module configured to refresh an entangled qubit state in the qubit array if a degradation error is detected therein. The quantum-state-refresh module is further configured to detect a degradation error by performing a redundant measurement of a set of syndrome values corresponding to the quantum stabilizer code. The redundant measurement is based on an error-correction code defined using the generator matrix of the quantum stabilizer code and a corresponding supplemental parity-check matrix. In an example embodiment, each of the generator and supplemental parity-check matrices may have an inclined-stripe form.

At least some embodiments provide improvements in the reliability of the measured syndrome values, which can advantageously be used to significantly slow down the effective degradation rate of the entangled qubit states stored in the corresponding quantum memory system.

According to one embodiment, provided is an apparatus comprising: a register configured to store a coded entangled qubit state encoded using a quantum stabilizer code; a measurement circuit configured to perform a redundant measurement of a set of syndrome values corresponding to the coded entangled qubit state, the redundant measurement being performed based on an error-correction code defined using an ordered set of generator vectors of the quantum stabilizer code and a plurality of linearly independent combinations of the generator vectors; and an electronic decoder configured to use the error-correction code to correct a measurement error in the set of syndrome values on which the redundant measurement has been performed; and wherein a generator matrix defined by the ordered set of generator vectors has a first inclined-stripe form.

BRIEF DESCRIPTION OF THE DRAWINGS

Other aspects, features, and benefits of various disclosed embodiments will become more fully apparent, by way of example, from the following detailed description and the accompanying drawings, in which:

FIGS. 2A-2C show block diagrams of syndrome-measurement circuitry that can be used in the memory system of FIG. 1 according to an embodiment;

DETAILED DESCRIPTION

Some embodiments may benefit from at least some features disclosed in U.S. Pat. Nos. 8,324,120, 8,633,092, 8,987,703, 9,286,154, 9,762,262, and 9,944,520, all of which are incorporated herein by reference in their entirety.

A classical convolutional code is an error-correction code that generates encoded symbols via the sliding application of a Boolean polynomial function to a data stream. The sliding application represents the "convolution" of the encoder over the data, which is reflected in the name of the code, i.e., "convolutional code." The sliding nature of the convolutional code facilitates trellis decoding, in which the corresponding trellis is time-invariant. The time-invariant trellis allows the convolutional codes to be decoded using maximum-likelihood soft-decision decoding implemented with practical circuits of tractable complexity.

In contrast, a block error-correction code is generally represented by a time-variant trellis and, as such, is typically hard-decision decoded.

Convolutional codes further differ from block codes in that the convolutional encoder has a memory, giving rise to a corresponding impulse response that is spread out in time. For example, a (m, k, M) convolutional code can be implemented using a linear circuit having k inputs, m outputs, and a sequential memory (e.g., a shift register) of length M, where m, k, and M are positive integers, and m>k. In a special case of k=1, the input sequence does not need to be divided into blocks and can be processed continuously. The memory length M is typically selected to be sufficiently large to support the desired error-correction capacity. Due to the code memory, the m encoder outputs at any given time depend not only on the k inputs at that particular time, but also on the ceil(M/k) previous input blocks (of k inputs each).

In most practical systems, codewords of infinite length are not used. For example, to generate a codeword of a finite length, the convolutional encoder can be configured to enter ceil(M/k) input blocks chosen so that to get zeros in all M memory elements and atm outputs at an appropriate time after encoding K inputs, where K=rk and r is a positive integer. Then, the encoder can terminate the codeword. It is not difficult to see that the length n of the obtained codeword is an integer multiple of m, i.e., n=cm, where c is a positive integer. In this case, the number n can be referred to as the total length of the code.

Various embodiments disclosed herein adapt classical convolutional codes for use in quantum stabilizer codes. Such adapted codes may be referred to herein as quantum convolutional codes.

An overview of quantum stabilizer codes can be found, e.g., in A. Ashikhmin, S. Litsyn, "Foundations of Quantum Error Correction," AMS/IP Studies in Advanced Mathematics, 41: Recent Trends in Coding Theory and its Applications, pp. 151-185, 2007, which is incorporated herein by reference in its entirety.

Figure 1:
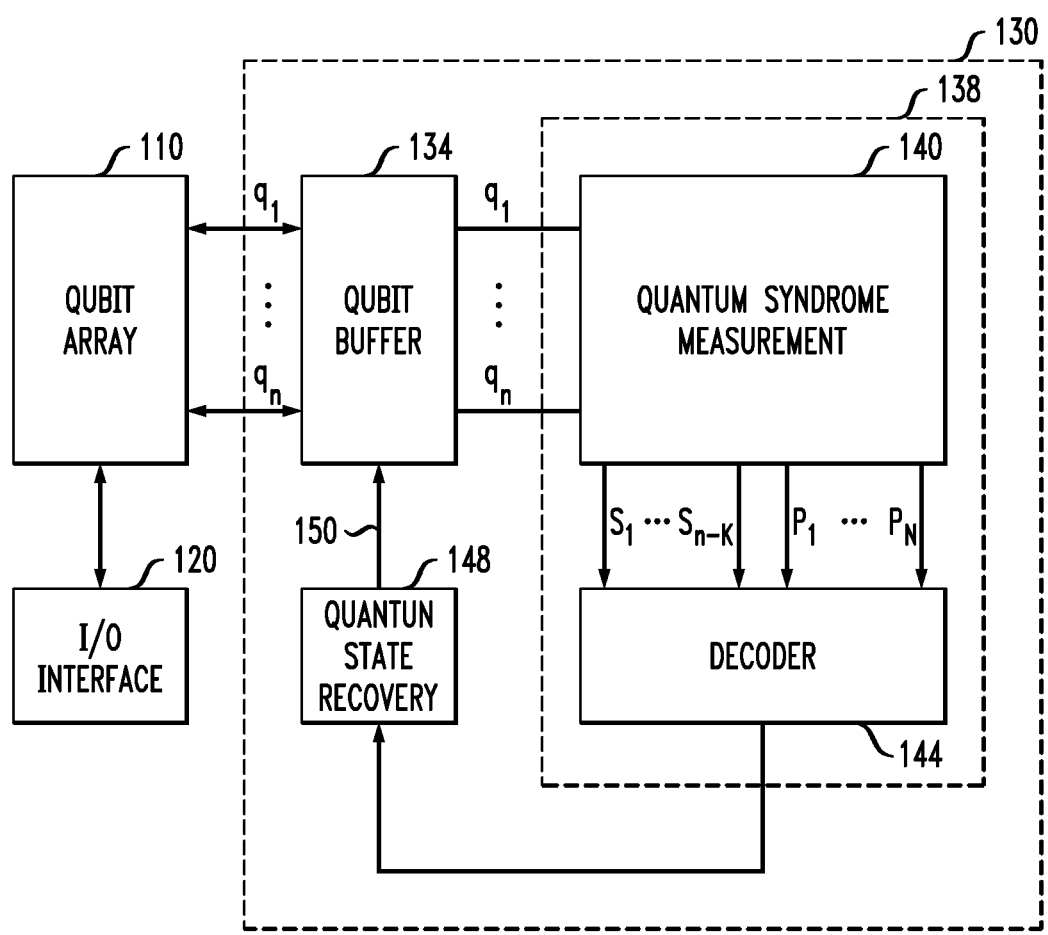
FIG. 1 shows a block diagram of a memory system according to an embodiment.

FIG. 1 shows a block diagram of a memory system 100 according to an embodiment. Memory system 100 comprises a qubit array 110 configured to store therein one or more quantum states. The quantum states can be written in and read out of qubit array 110 via an input/output (I/O) interface 120. Memory system 100 further comprises a qubit-state-refresh (QSR) module 130 that operates to effectively protect the quantum states stored in qubit array 110 from accumulating errors, thereby enabling memory system 100 to store quantum states with relatively high fidelity for a relatively long time.

As used herein, the term "qubit" refers to a device that comprises a two-state quantum-mechanical system. Examples of suitable two-state quantum-mechanical systems include, but are not limited to: (i) two spin states of a particle having a spin of ½; (ii) the ground and excited states of an atom; (iii) two polarization states of a photon, (iv) edge states of an FQHE liquid droplet; and (v) states of a superconducting junction.

The two states with respect to which the state of a qubit can be measured are referred to as the basis states. A non-entangled qubit state is a linear superposition of the basis states. Multi-qubit states differ from classical multi-bit states in that the former can be formed to exhibit entanglement. An entangled qubit state cannot be decomposed into a simple product of single-qubit basis states, but rather, it can be expressed as a linear combination or superposition of different products of single-qubit basis states. QSR module 130 is configured to use the entangled nature of a multi-qubit state, e.g., as further detailed below, to effectively protect qubit array 110 from accumulating errors in the qubit states therein.

According to an example embodiment, each entangled qubit state stored in qubit array 110 is encoded using a quantum convolutional code (QCC), Q. The QCC code Q of total length n and dimension K operates on a linear subspace of dimension $2^K$ in the complex space $S^D$, where $D=2^n$. The parameters n and K of the QCC code Q directly correspond to the parameters n and K, respectively, of a classical (n, K, M) convolutional code. When applied to qubits, the QCC code Q encodes a K-qubit state into an n-qubit state, thereby providing redundancy, which can be used to correct qubit-state errors occurring in memory system 100 for one or more of the above-indicated reasons. Example embodiments of the QCC code Q are described in more detail below in reference to Eqs. (1)-(3) and (9)-(11).

In operation, QSR module 130 is configured to serially subject to processing the different n-qubit states stored in qubit array 110. The corresponding sets of qubits may be transferred to QSR module 130, one set at a time, based on a preset schedule, e.g., in a round-robin sequence. QSR module 130 is further configured to subject each received set of qubits to error-correction processing, e.g., as further described below, if a qubit-state error is detected.

In an example embodiment, the error-correction processing in QSR module 130 may comprise the steps of: (i) determining whether or not the received set of qubits corresponding to an entangled quantum state has an error, and (ii) if an error is detected, then changing the qubit state to correct the detected error. The set of qubits, now in a changed and presumably error-free entangled quantum state, is transferred back to qubit array 110. If QSR module 130 does not detect an error in the qubit state, then the corresponding entangled quantum state is presumed to be error-free, and the qubit set can be transferred back to qubit array 110 without changes to the qubit state.

In an example embodiment, QSR module 130 comprises a qubit buffer 134, an error-detection circuit 138, and a quantum-state recovery circuit 148 interconnected as indicated in FIG. 1. Qubit buffer 134 comprises suitable qubit registers configured to hold the received qubits for the duration of the corresponding error-correction processing. Error-detection circuit 138 is configured to implement the above-specified step (i) of the error-correction processing. Quantum-state recovery circuit 148 is configured to act on the entangled quantum state in qubit buffer 134 to implement the above-specified step (ii) of the error-correction processing.

In an example embodiment, error-detection circuit 138 includes a syndrome-measurement circuit 140 and an electronic decoder 144 coupled to each other and to other circuits in QSR module 130 as indicated in FIG. 1.

Syndrome-measurement circuit 140 is a quantum circuit configured to perform a redundant measurement of a set of syndrome values on the n-qubit state in qubit buffer 134. The result of this measurement is a binary vector $v=(s_1, \ldots, s_{n-K}, p_1, \ldots, p_N)$ comprising (n−K+N) binary values, where N is a positive integer. The first n−K binary values $(s_1, \ldots, s_{n-K})$ in vector v carry the syndrome bits, e.g., syndrome values, corresponding to the QCC code Q. The next N binary values $(p_1, \ldots, p_N)$ in vector v carry the parity bits that can be used to detect possible errors in the measurement of the syndrome bits.

The above-indicated measurement of the set of syndrome values is a "redundant" measurement because the result of said measurement, e.g., the binary vector v, contains more measured values than the number of independent syndrome values in the set that is being measured, e.g., (n−K+N)>(n−K).

As already indicated above, quantum gates in quantum circuits, such as syndrome-measurement circuit 140, have a relatively high inherent level of errors, which causes the probability of an erroneous syndrome measurement to be correspondingly relatively high. Hence, syndrome-measurement circuit 140 is configured to perform redundant measurements in accordance with an error-correction code C constructed based on the QCC code Q. For this purpose, syndrome-measurement circuit 140 includes quantum circuitry that causes the generated binary vector v to be a codeword of the error-correction code C when all of binary values $s_1, \ldots, s_{n-K}, p_1, \ldots, p_N$ are measured accurately. An example embodiment of the error-correction code C is described in more detail below in reference to Eqs. (1)-(15). Example embodiments of the corresponding quantum circuitry for implementing circuit 140 are described in more detail below in reference to FIGS. 2A-2C.

If vector v generated by syndrome-measurement circuit 140 is a codeword of the error-correction code C, then decoder 144 truncates vector v to remove the parity values $p_1, \ldots, p_N$ and passes the measured syndrome values $s_1, \ldots, s_{n-K}$ to quantum-state recovery circuit 148.

If the vector v generated by syndrome-measurement circuit 140 is determined to not be a valid codeword of the error-correction code C, then the binary values $s_1, \ldots, s_{n-K}$, $p_1, \ldots, p_N$ are processed as not having been measured accurately. In this case, decoder 144 is configured to process the measured vector v in accordance with the error-correction code C to determine the most-probable valid codeword corresponding to the measured vector v. After such processing, decoder 144 truncates the determined most-probable codeword and passes the corresponding most-probable syndrome values $s_1, \ldots, s_{n-K}$ to quantum-state recovery circuit 148.

Quantum-state recovery circuit 148 uses the syndrome values $s_1, \ldots, s_{n-K}$ received from decoder 144 to correct an error (if any) in the n-qubit state stored in qubit buffer 134. More specifically, if the syndrome values $s_1, \ldots, s_{n-K}$ received from decoder 144 are all zeros, then the n-qubit state in qubit buffer 134 is presumed to be error-free, and no error correction is performed on it by quantum-state recovery circuit 148. However, if any of the syndrome values $s_1, \ldots, s_{n-K}$ received from decoder 144 is not a zero, then the n-qubit state in qubit buffer 134 is presumed to have an error. In this case, quantum-state recovery circuit 148 uses the syndrome values $s_1, \ldots, s_{n-K}$ received from decoder 144 to determine the most-probable error operator E that has caused the corresponding original entangled quantum state to transform into the entangled quantum state that exhibited these syndrome values. The book by Frank Gaitan, entitled "Quantum Error Correction and Fault Tolerant Quantum Computing," Taylor & Francis, 2008, discloses suitable algorithms that can be used for this determination in quantum-state recovery circuit 148 according to an embodiment. This book by Frank Gaitan is incorporated herein by reference in its entirety. In alternative embodiments, other suitable algorithms for the determination of error operator E based on syndrome values $s_1, \ldots, s_{n-K}$ of quantum stabilizer code Q can similarly be used.

In one embodiment, error operator E may be represented as a square complex-valued matrix. To correct the error corresponding to error operator E, quantum-state recovery circuit 148 is first configured to find an inverse error operator $E^{-1}$, e.g., using a suitable conventional matrix-inversion algorithm. The resulting inverted matrix is denoted $E^{-1}$. Based on $E^{-1}$, quantum-state recovery circuit 148 operates to generate a stimulus 150 that changes the n-qubit state held in qubit buffer 134 in a manner that corrects the error caused by error operator E. If the error correction is performed properly, then the corrected entangled quantum state in qubit buffer 134 will most-probably have an all-zero syndrome.

In an example embodiment, the QCC code Q can be represented by the generator matrix G(Q).

A general form of the generator matrix G(Q) is given by Eq. (1):

$$G(Q) = \begin{bmatrix} g_1 \\ g_2 \\ \ldots \\ g_{n-K} \end{bmatrix} \quad (1)$$

where $g_i$ (i=1, 2, ..., n−K) is a generator vector having n elements. As such, the generator matrix G(Q) has the size of (n−K)×n matrix elements.

In an example embodiment, the generator vectors $g_i$ are selected such that the generator matrix G(Q) has the form shown in Eq. (2):

$$G(Q) = \begin{bmatrix} G_1 & G_2 & G_3 & \ldots & G_v & 0 & 0 & 0 & 0 & \ldots & 0 \\ 0 & G_1 & G_2 & G_3 & \ldots & G_v & 0 & 0 & 0 & \ldots & 0 \\ 0 & 0 & G_1 & G_2 & G_3 & \ldots & G_v & 0 & 0 & \ldots & 0 \\ . & . & . & . & . & . & . & . & . & . & . \end{bmatrix} \quad (2)$$

where each $G_j$ (j=1, 2, ..., v) is an r×m matrix over GF(4)={0, 1, w, $w^2$} (where GF(4) denotes the Galois field of size 4). The parameters r and m are typically small positive integers. The parameter v is referred to as the constrained length and is typically a small positive integer as well.

According to Eq. (2), the generator matrix G(Q) has an "inclined-stripe" form. Herein, an inclined-stripe form means that each row block of G(Q) has v sequential non-zero elements, each of the non-zero elements being the respective matrix $G_j$. In such a form, the remaining matrix elements of G(Q) are all zeros. Also, in such a form, at each next block row, the first non-zero element is shifted by a fixed number of columns from the first non-zero element of the preceding block row. For example, in the example corresponding to Eq. (2), each row block has r rows. In the first row block of G(Q), the first v elements are the matrices $G_j$, where j=1, 2, ..., v. In each subsequent row block, the matrix block $[G_1 \ldots G_v]$ is shifted to the right by m columns with respect to the preceding position thereof. These shifts produce an inclined stripe of non-zero elements in G(Q), as indicated in Eq. (2).

The generator matrix G(Q) of Eq. (2) is also self-orthogonal. Mathematically, this property of G(Q) can be expressed using Eq. (3):

$$G * G^T = 0 \quad (3)$$

where the "*" symbol denotes the trace inner product; and the T in the superscript means transposed.

The multiplication rules for the elements of the set {0, 1, w, $w^2$} are given by the following table:

| × | 0 | 1 | w | $w^2$ |
|---|---|---|---|---|
| 0 | 0 | 0 | 0 | 0 |
| 1 | 0 | 1 | w | $w^2$ |
| w | 0 | w | $w^2$ | 1 |
| $w^2$ | 0 | $w^2$ | 1 | w |

The summation rules for the elements of the set {0, 1, w, $w^2$} are given by the following table:

| + | 0 | 1 | w | $w^2$ |
|---|---|---|---|---|
| 0 | 0 | 1 | w | $w^2$ |
| 1 | 1 | 0 | $w^2$ | w |
| w | w | $w^2$ | 0 | 1 |
| $w^2$ | $w^2$ | w | 1 | 0 |

In an example embodiment, the error-correction code C corresponding to the generator matrix G(Q) of Eq. (2) can be constructed as follows.

First, we construct N vectors $f_1, f_2, \ldots, f_N$ using different linear combinations (e.g., linearly independent combinations) of the generator vectors $g_i$ (see Eq. (1)). Eq. (4) gives a general mathematical expression for the vector $f_q$ (where q=1, 2, . . . , N):

$$f_q = \sum_{i=1}^{n-K} a_{iq} g_i \quad (4)$$

where each of the coefficients $a_{iq}$ can be either 0 or 1, i.e., $a_{1q} \in \{0,1\}$. The coefficients $a_{iq}$ define an N×(n−K) matrix A, the general form of which is given by Eq. (5):

$$A = [A_1 A_2 \ldots A_{n-K}] \quad (5)$$

where $A_i$ (where i=1, 2, . . . , n−K) is a column vector having N elements defined by Eq. (6):

$$A_i = \begin{bmatrix} a_{1i} \\ a_{2i} \\ \ldots \\ a_{Ni} \end{bmatrix} \quad (6)$$

Matrix A may be referred to herein as a supplemental parity-check matrix corresponding to the generator matrix G(Q).

In an example embodiment, the coefficients $a_{iq}$ are selected such that the matrix A has an inclined-stripe form. Mores specifically, the first column, $A_1$, of the matrix A has a form of two concatenated vectors, as shown in Eq. (7):

$$A_1 = [a_0 0]^T \quad (7)$$

where $a_0$ is the first vector having my elements therein; the zero denotes the second vector having (N−mv) zeros as the elements thereof; and the T in the superscript means transposed. Some but not all of the elements of the vector $a_0$ may be zero. Other columns of the matrix A can be obtained from the column $A_1$ by incrementally shifting the position of the vector $a_0$ down the column (with the shift increment being, e.g., r rows), and also cyclically shifting the zeros to fill up the freed positions previously taken by the vector $a_0$. For example, the second column, $A_2$, has a form of three concatenated vectors, as shown in Eq. (8):

$$A_2 = [0 a_0 0]^T \quad (8)$$

where the first 0 denotes an all-zero vector having r zeros as the elements thereof; and the second 0 denotes an all-zero vector having (N−mv−r) zeros as the elements thereof. Thus, the position of the vector $a_0$ in the column $A_2$ is shifted down the column by r rows with respect to the position thereof in the column $A_1$. The third column, $A_3$, has a form that is qualitatively similar to that shown in Eq. (8), except that there are 2r zeros preceding the vector $a_0$ and (N−my−2r) zeros following the vector $a_0$. Thus, the position of the vector $a_0$ in the column $A_3$ is shifted down the column by r rows with respect to the position thereof in the column $A_2$, and so on.

Note that the above-described inclined-stripe form of the matrix A is somewhat different form the inclined-stripe form of the generator matrix G(Q) (Eq. (2)). More specifically, the inclined-stripe form of the generator matrix G(Q) is due to the incremental shift of the matrix block $[G_1 \ldots G_v]$ to the right as the row index increases. In contrast, the inclined-stripe form of the supplemental parity-check matrix A is due to the incremental shift of the vector $a_0$ down as the column index increases. This qualitative difference can be indicated, e.g., by referring to the supplemental parity-check matrix A as having the transposed inclined-stripe form with respect to the inclined-stripe form of the generator matrix G(Q). Indeed, the matrices $A^T$ and G(Q) have qualitatively similar inclined-stripe forms.

For illustration purposes and without any implied limitation, the subsequent description of some embodiments is given with reference to the example matrices G(Q) and A defined using Eqs. (9)-(12). Based on the provided description, a person of ordinary skill in the art will understand how to construct alternative embodiments of matrices G(Q) and A and of the corresponding quantum circuits for syndrome-measurement circuit 140.

In one example embodiment, the generator matrix G(Q) may have the inclined-stripe form shown in Eq. (9):

$$G(Q) = \begin{bmatrix} 1 & 1 & 1 & 1 & w & w^2 & 0 & 0 & 0 & 0 & \ldots & 0 \\ w & w & w & w & w^2 & 1 & 0 & 0 & 0 & 0 & \ldots & 0 \\ 0 & 0 & 0 & 1 & 1 & 1 & 1 & w & w^2 & 0 & \ldots & 0 \\ 0 & 0 & 0 & w & w & w & w & w^2 & 1 & 0 & \ldots & 0 \\ \cdot & \cdot & \cdot & \cdot & \cdot & \cdot & \cdot & \cdot & \cdot & \cdot & & \cdot \end{bmatrix} \quad (9)$$

This embodiment corresponds to r=2, m=3, and v=2. The corresponding matrices $G_1$ and $G_2$ are given by Eqs. (10) and (11), respectively:

$$G_1 = \begin{bmatrix} 1 & 1 & 1 \\ w & w & w \end{bmatrix} \quad (10)$$

$$G_2 = \begin{bmatrix} 1 & w & w^2 \\ w & w^2 & 1 \end{bmatrix} \quad (11)$$

An example embodiment of the supplemental parity-check matrix A corresponding to the generator matrix G(Q) of Eq. (9) is shown in Eq. (12):

$$A = \begin{bmatrix} 1 & . & & & & & \\ 1 & . & & & & & \\ 0 & 1 & . & & & & \\ 1 & 1 & . & & & & \\ 1 & 0 & 1 & . & & & \\ 1 & 1 & 1 & . & & & \\ & 1 & 0 & . & & & \\ & 1 & 1 & . & & & \\ & & 1 & . & & & \\ & & 1 & . & & & \\ . & . & . & . & . & & \\ & & & & & & \end{bmatrix} \quad (12)$$

Herein, the vector $a_0$ is (1 1 0 1 1 1), and the zeros that do not belong to the shown copies of the vector $a_0$ are not explicitly shown for a clearer presentation of the transposed inclined-stripe form of this matrix A.

Figure 2B:
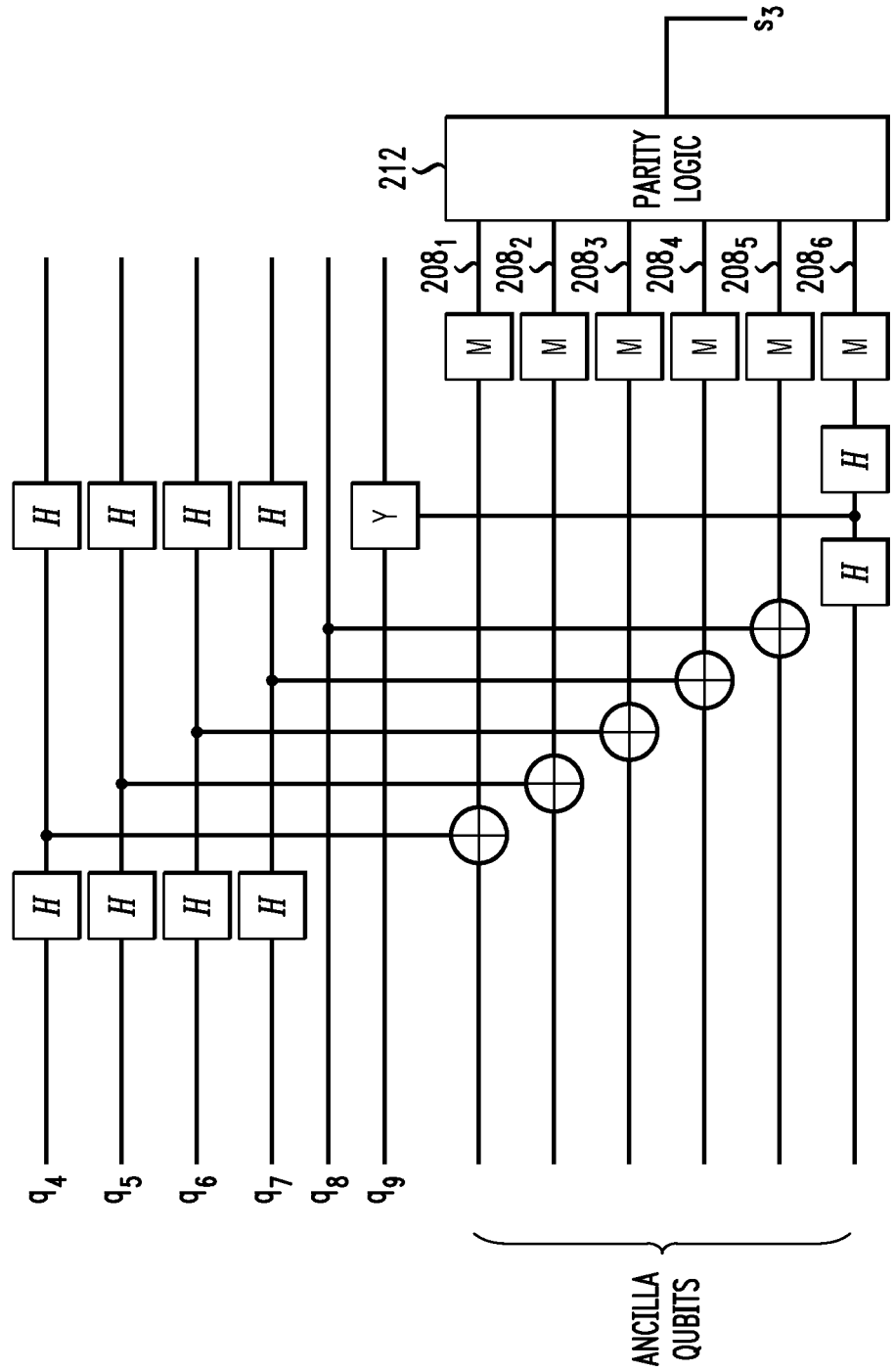
Figure 2C:
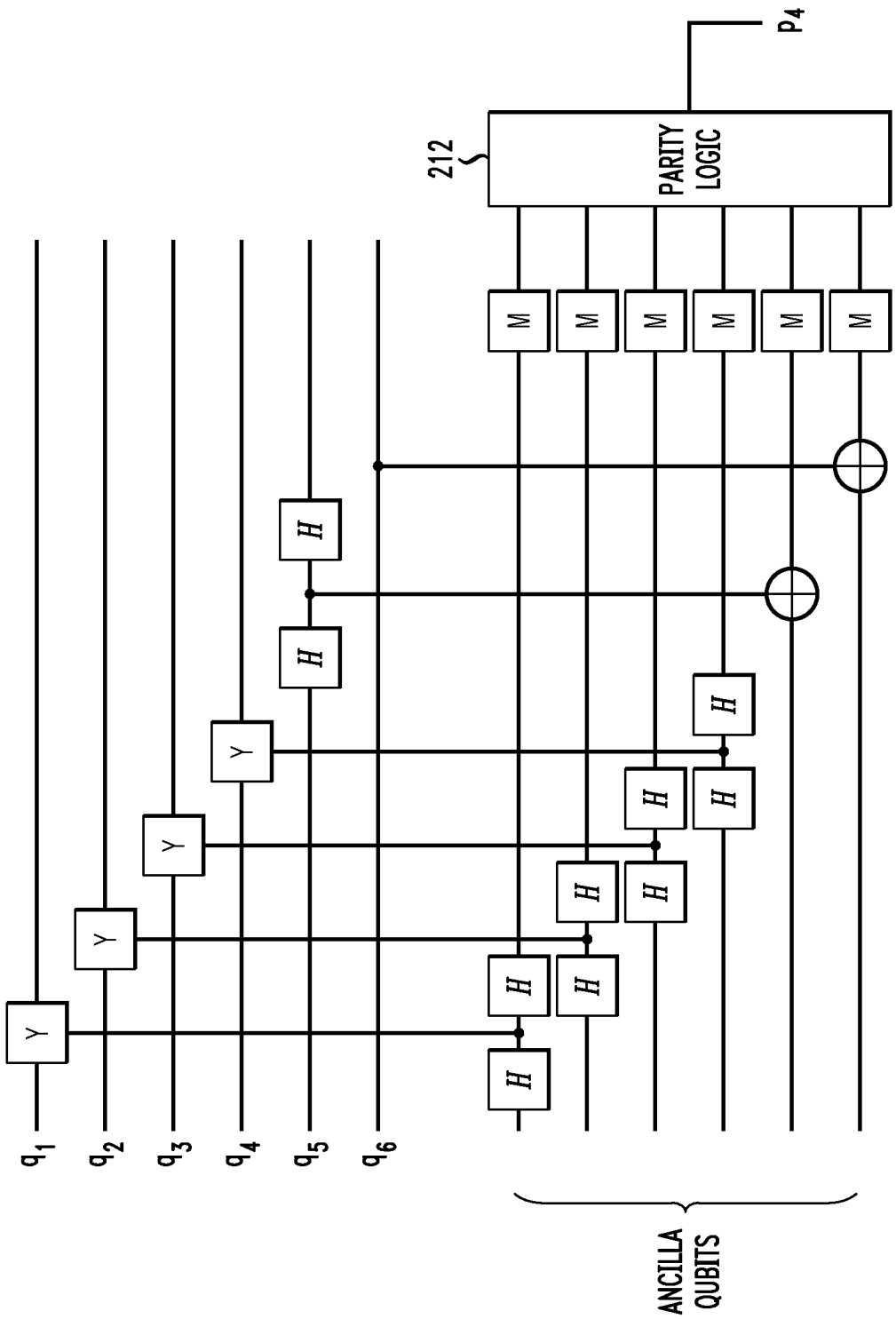

FIGS. 2A-2C show block diagrams of syndrome-measurement circuit 140 (FIG. 1) according to an embodiment. More specifically, FIG. 2A shows an overall block diagram of syndrome-measurement circuit 140. Each of modules 210 of circuit 140 is designed to perform measurements in accordance with the corresponding row of the generator matrix G(Q). Each of modules 220 of circuit 140 is designed to perform measurements in accordance with the corresponding row of the supplemental parity-check matrix A.

As an example, FIG. 2B shows a block diagram of a module 210₃ in circuit 140, which module is configured to measure the value of syndrome bit $s_3$. This module 210₃ is designed to perform measurements in accordance with the third row of the generator matrix G(Q) shown in Eq. (9). FIG. 2C shows a block diagram of a module 220₄ in circuit 140, which is configured to measure the value of parity bit $p_4$. This particular module 220₄ is designed to perform measurements in accordance with the fourth row of the supplemental parity-check matrix A shown in Eq. (12). Based on the block diagrams shown in FIGS. 2B and 2C and the corresponding description provided below, a person of ordinary skill in the art will be able to make and use, without undue experimentation, each and any of the modules 210 and 220 in the corresponding embodiment of circuit 140.

Referring to FIG. 2A, syndrome-measurement circuit 140 is configured to perform a syndrome measurement for an n-qubit state encoded in qubits $q_1$-$q_n$. This measurement is performed by generating vector $v=(s_1, \ldots, s_{n-K}, p_1, \ldots, p_N)$. Each component value for vector v is generated by a corresponding one of measurement modules 210₁-210$_{n-K}$ and 220₁-220$_N$, wherein measurement modules 210₁-210$_{n-K}$ are configured to generate vector components $s_1$-$s_{n-K}$, respectively, and measurement modules 220₁-220$_N$ are configured to generate vector components $p_1$-$p_N$, respectively.

Each of measurement modules 210₁-210$_{n-K}$ is configured to generate a respective one of syndrome values $s_1$-$s_{n-K}$ by performing a measurement on a respective subset of qubits $q_1$-$q_n$, which measurement is based on a respective one of generator vectors $g_i$ (i=1, 2, ..., n−K) representing the quantum stabilizer code Q. As already indicate above, generator vector $g_i$ is located in the i-th row of the generator matrix G(Q) (see Eq. (1)). For the example embodiment described further below in reference to FIG. 2B, the generator matrix G(Q) is given by Eq. (9).

Each of measurement modules 220₁-220$_N$ is configured to generate a respective one of parity values $p_1$-$p_N$ by performing a measurement on a respective subset of qubits $q_1$-$q_n$, which measurement is based on a respective one of vectors $f_q$ (see Eq. (4)), where q=1, 2, ..., N. As already indicate above, vector $f_q$ is defined by the q-th row of the supplemental parity-check matrix A. For the example embodiment described further below in reference to FIG. 2C, the supplemental parity-check matrix A is given by Eq. (12).

FIG. 2B shows a block diagram of measurement module 210₃ according to an example embodiment. Measurement module 210₃ is an example of a measurement module configured to generate a syndrome bit value (i.e., $s_3$) for vector v. More specifically, measurement module 210₃ is configured to measure a state formed by coupling the entangled quantum state of qubits $q_4$-$q_9$ to a reference state of ancilla qubits based on a coupling defined by the generator vector $g_3$:

$$g_3 = [0001111ww^2 0 \ldots 0] \quad (13)$$

Eq. (13) can be obtained, e.g., by comparing Eqs. (1) and (9). Since the only non-zero elements of this generator vector $g_3$ are the fourth through ninth elements, module 210₃ is coupled only to the qubits $q_4$-$q_9$, which are a subset of the qubits $q_1$-$q_n$. The ancilla qubits are reference qubits that are prepared, as known in the pertinent art, to be in a particular preselected quantum state.

Measurement module 210₁ comprises ten quantum Hadamard gates H, five quantum CNOT gates ⊕, a quantum controlled Y-gate Y, and six quantum measurement gates M, all arranged as shown in FIG. 2B. A person of ordinary skill in the art will recognize that quantum Hadamard gates, quantum CNOT gates, quantum controlled Y-gates, and quantum measurement gates are elementary quantum gates from the universal quantum-gate set, which is conventionally used in the construction of quantum circuits. Descriptions of such elementary quantum gates can be found, e.g., in (i) A. Barenco, et al., "Elementary Gates for Quantum Computation," Physical Review A, 1995, v. 52, pp. 3457-3467; (ii) the book by Goong Chen, et al., "QUANTUM COMPUTING DEVICES: PRINCIPLES, DESIGNS, AND ANALYSIS," CRC Press, 2007; and (iii) the book by M. Nielsen and I. Chuang, "Quantum Computation and Quantum Information," Cambridge University Press, 2000, all of which are incorporated herein by reference in their entirety. Additional description of elementary quantum gates can be found, e.g., in the above-cited book by Frank Gaitan.

The fourth element of the generator vector $g_3$ defined by Eq. (13) is 1. Accordingly, module 210₃ is configured to couple qubit $q_4$ and an ancilla qubit via a Hadamard gate and a CNOT gate. Each of the fifth, sixth, and seventh elements of the generator vector $g_3$ defined by Eq. (13) is also 1. Accordingly, the coupling arrangement applied to qubit $q_4$ is repeated in module 210₃ for qubits $q_5$, $q_6$, and $q_7$. The eighth element of the generator vector $g_3$ defined by Eq. (13) is w. Accordingly, module 210₃ is configured to couple qubit $q_8$ and an ancilla qubit via a CNOT gate, while no Hadamard gate is used. The ninth element of the generator vector $g_3$ defined by Eq. (13) is $w^2$. Accordingly, module 210₃ is configured to couple qubit $q_9$ and an ancilla qubit via a controlled Y-gate and a Hadamard gate.

Each quantum measurement gate M in measurement module 210₃ is configured to (i) measure the qubit state applied to its input port (located at the left side of the gate in FIG. 2B) and (ii) based on the measurement, generate a corresponding electrical output signal 208$_i$ (i=1, 2, ..., 6) at its output port (located at the right side of the gate in FIG. 2B). Each quantum measurement gate M then applies its electrical output signal 208$_i$ to a parity logic circuit 212 connected to receive electrical output signals 208₁-208₆.

In an example embodiment, parity logic circuit 212 is configured to slice each of signals 208₁-208₆, thereby converting each of them into a respective binary value (0 or 1). Parity logic circuit 212 is further configured to output (i) a binary "zero" if the number of zeros generated from signals 208₁-208₆ is even, and (ii) a binary "one" if the number of zeros generated from signals 208₁-208₆ is odd. In effect, the latter function of parity logic circuit 212 is the same as that of a conventional six-input exclusive-OR (XOR) gate.

Alternative embodiments of parity logic circuit 212 are described, e.g., in the above-cited U.S. Pat. No. 9,286,154.

FIG. 2C shows a block diagram of measurement module 220₄ according to an example embodiment. Module 220₄ is an example of a measurement module configured to generate a parity bit value (i.e., $p_4$) for vector v.

Module 220₄ is configured to perform measurements in accordance with the vector $f_4$ (see Eq. (4)). In this particular embodiment, the vector $f_4$ is defined by the fourth row of the supplemental parity-check matrix A given by Eq. (12). Since the only non-zero elements of that row are located in the first and second columns (see Eq. (12)), the vector $f_4$ is represented the following linear combination of the of generator vectors $g_i$:

$$f_4 = g_1 + g_2 \quad (14)$$

Using the generator vectors $g_1$ and $g_2$ from Eq. (9) and the summation rules for the elements of the set $\{0, 1, w, w^2\}$ given in the corresponding one of the two tables shown above, Eq. (14) can equivalently be rewritten as follows:

$$f_4 = [w^2 w_2 w_2 w_2 w 0 \ldots 0] \quad (15)$$

Since the only non-zero elements of this vector $f_4$ are the first through sixth elements, module $220_4$ is coupled only to the qubits $q_1$-$q_6$.

The first element of the vector $f_4$ defined by Eq. (15) is $w^2$. Accordingly, module $220_4$ is configured to couple qubit $q_1$ and an ancilla qubit via a controlled Y-gate and a Hadamard gate. This gate arrangement is similar to the gate arrangement used in module $210_3$ for qubit $q_9$ (see FIG. 2B). Each of the second, third, and fourth elements of the vector $f_4$ defined by Eq. (15) is also $w^2$. Accordingly, the coupling arrangement applied to qubit $q_1$ is repeated in module $220_4$ for qubits $q_2$, $q_3$, and $q_4$. The fifth element of the vector $f_4$ defined by Eq. (15) is 1. Accordingly, module $220_4$ is configured to couple qubit $q_5$ and an ancilla qubit via a Hadamard gate and a CNOT gate. This gate arrangement is similar to the gate arrangement used in module $210_3$ for qubit $q_4$ (see FIG. 2B). The sixth element of the vector $f_4$ defined by Eq. (15) is $w$. Accordingly, module $220_4$ is configured to couple qubit $q_6$ and an ancilla qubit via a CNOT gate, while no Hadamard gate is used. This gate arrangement is similar to the gate arrangement used in module $210_3$ for qubit $q_6$ (see FIG. 2B). The quantum measurement gates M and parity logic circuit 212 in measurement module $220_4$ operate similar to those in measurement module $210_3$ (FIG. 2B).

Figure 3:
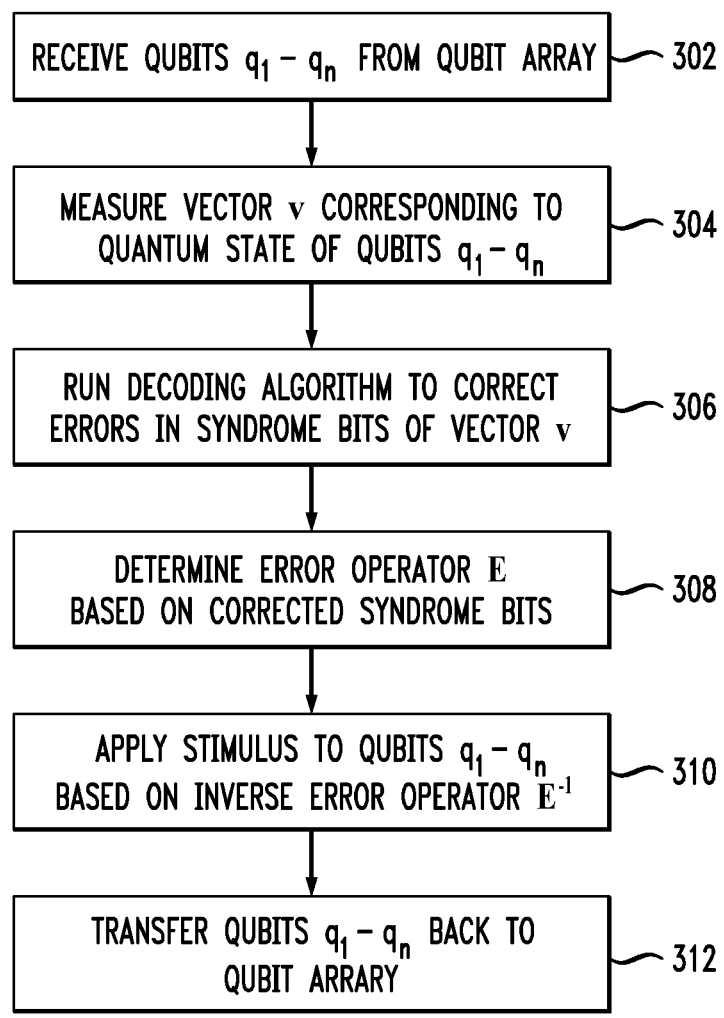
FIG. 3 shows a flowchart of a memory-refresh method that can be used in the memory system of FIG. 1 according to an embodiment.

FIG. 3 shows a flowchart of a memory-refresh method 300 that can be used in memory system 100 (FIG. 1) according to an embodiment. Method 300 is described below in continuing reference to FIGS. 1-2.

At step 302 of method 300, a set of n qubits (e.g., qubits $q_1$-$q_n$) is transferred from array 110 to buffer 134 (FIG. 1). The transferred qubits $q_1$-$q_n$ are in an entangled quantum state initially generated using the above-described quantum stabilizer code Q. By the time at which step 302 is performed, the entangled quantum state of qubits $q_1$-$q_n$ may or may not have degraded from the initial state.

At step 304, syndrome-measurement circuit 140 is used to measure the binary vector $v=(s_1, \ldots, s_{n-K}, p_1, \ldots, p_N)$ corresponding to the quantum state of the qubits $q_1$-$q_n$ transferred to buffer 134 at step 302. The first n–K binary values $(s_1, \ldots, s_{n-K})$ of the vector v are measured using measurement modules $210_1$-$210_{n-K}$ (see FIGS. 2A, 2B). As already indicated above, each of the measurement modules $210_1$-$210_{n-K}$ has quantum circuitry configured to perform measurements in accordance with a respective row of the operative generator matrix G(Q) (see, e.g., FIG. 2B). The next N binary values $(p_1, \ldots, p_N)$ of the vector v are measured using measurement modules $220_1$-$220_N$ (see FIGS. 2A, 2C). Each of the measurement modules $220_1$-$220_N$ has quantum circuitry configured to perform measurements in accordance with a respective row of the operative supplemental parity-check matrix A (see, e.g., FIG. 2C). The measured binary vector v is then supplied to decoder 144.

At step 306, decoder 144 runs a suitable decoding algorithm to correct errors (if any) in the binary values $(s_1, \ldots, s_{n-K})$ of the vector v received from syndrome-measurement circuit 140 at step 304. After the error correction, decoder 144 transmits the resulting binary values $(s_1, \ldots, s_{n-K})'$ to quantum-state recovery circuit 148 (see FIG. 1).

A person of ordinary skill in the art will understand that an all-zero set of binary values $(s_1, \ldots, s_{n-K})'$ indicates that, most likely, the current quantum state of the qubits $q_1$-$q_n$ has not degraded from the initial quantum state thereof. On the other hand, if the set of binary values $(s_1, \ldots, s_{n-K})'$ contains one or more binary "ones," then some degradation of the quantum state of the qubits $q_1$-$q_n$ may have occurred from the initial quantum state thereof.

In general, any decoding algorithm corresponding to the code C defined by the matrices G(Q) and A can be used in decoder 144. For example, in one possible embodiment, decoder 144 can be configured to execute step 306 using trellis-based decoding, e.g., Viterbi-type decoding. The corresponding trellis can be constructed in a relatively straightforward manner based on the operative matrices G(Q) and A.

In an example embodiment, the trellis for decoder 144 can be constructed using the following approach.

First, it should be noted that the generator matrix G(Q) of Eq. (2) defines a quantum-stabilizer code Q that is analogous to a classical convolutional code. This property of the code Q arises from the above-described inclined-stripe form of the generator matrix G(Q). In particular, the incremental shift of the matrix block $[G_1 \ldots G_v]$ in the generator matrix G(Q) can be analogized to the sliding application of a Boolean polynomial function in classical convolutional coding. Accordingly, the wealth of knowledge available in the field of classical convolutional coding regarding trellis construction can be readily applied to the trellis construction for any specific (e.g., defined by Eq. (9)) generator matrix G(Q) used in system 100.

Once the trellis corresponding to the generator matrix G(Q) is constructed, it can be modified in a relatively straightforward manner, as known in the pertinent art, to include additional check nodes corresponding to the supplemental parity-check matrix A. The resulting modified trellis can then be used in decoder 144 to perform the decoding directed at correcting errors (if any) in the binary values $(s_1, \ldots, s_{n-K})$ measured at step 304.

Although many different forms of the supplemental parity-check matrix A can conceivably be used to implement syndrome-measurement circuit 140, we discovered, through various numerical simulations, that relatively better results can typically be achieved when the matrix A has the above-described transposed inclined-stripe form (see, e.g., Eq. (12)). A person of ordinary skill in the art will understand that acceptable performance of syndrome-measurement circuit 140 may also be achievable using some other (e.g., different from the transposed inclined-stripe) forms of the supplemental parity-check matrix A.

At step 308, quantum-state recovery circuit 148 uses the non-zero syndrome values $(s_1, \ldots, s_{n-K})'$ received from decoder 144 at the conclusion of step 306 to determine the corresponding error operator E that most likely caused the initial quantum state of the qubits $q_1$-$q_n$ (which has an all-zero syndrome) to degrade into a quantum state characterized by the received non-zero syndrome. Step 308 can be implemented using any algorithm suitable for this purpose, e.g., some of the algorithms described in the above-cited book by Frank Gaitan.

Since steps 302-306 provide improvements in the reliability of the measured syndrome values compared to at least some prior-art methods, step 308 can provide a better (e.g., more-accurate) estimate of the actual error operator E. The use of the more-accurate error operators E in step 310 can, in turn, be used to slow down the effective degradation rate of the entangled qubit states stored in system 100 to a greater extent than that achievable with comparable prior-art methods.

At step 310, quantum-state recovery circuit 148 is configured to find an inverse error operator $E^{-1}$. Based on $E^{-1}$, quantum-state recovery circuit 148 then operates to generate a stimulus 150 that changes the quantum state of the qubits $q_1$-$q_n$ in a manner that corrects the error caused by the error operator E determined at step 308. If the above-described processing of method 300 is performed correctly, then the corrected quantum state of the qubits $q_1$-$q_n$ will most probably have an all-zero syndrome.

At step 312, the qubits $q_1$-$q_n$, in the quantum state generated at the conclusion of step 310 are transferred from buffer 134 back to array 110 (see FIG. 1).

Figure 4:
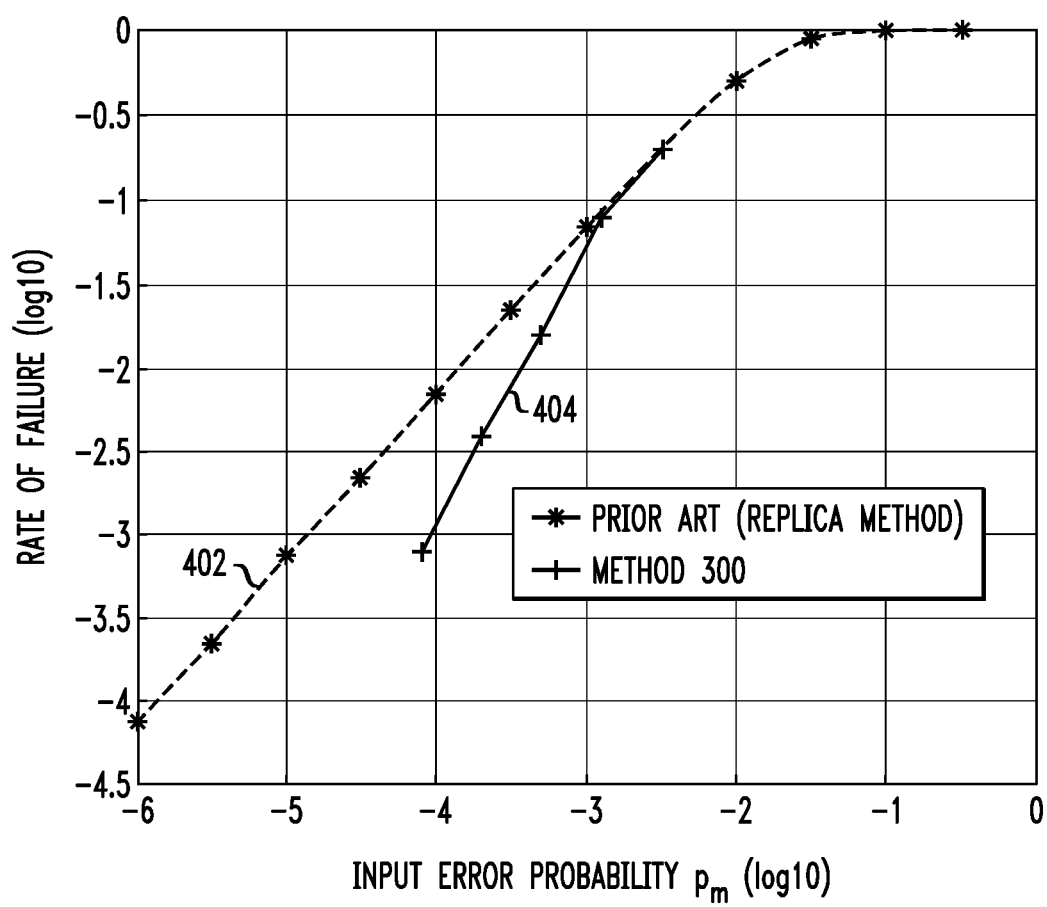
FIG. 4 graphically compares the performance of an embodiment of the memory-refresh method of FIG. 3 and a comparably configured prior-art method.

FIG. 4 graphically compares the performance of a prior-art replica method and a comparably configured embodiment of method 300. More specifically, the plots shown in FIG. 4 indicate the rates of failure of these two memory-refresh methods, with the term "failure" referring to the inability of the corresponding memory system to return the degraded quantum state of qubits $q_1$-$q_n$ back to the initial quantum state characterized by the all-zero syndrome.

Curve 402 illustrates the performance of the prior-art replica method. As known in the pertinent art, the replica method comprises repeated measurements of each of the syndrome bits. The binary value that occurs more often in these measurements is then used to define the respective value for the set $(s_1, \ldots, s_{n-K})'$. For example, if syndrome bit $s_j$ is measured three times and the measurement results are 0, 1, and 0, respectively, then the value of $s_j$ in the set $(s_1, \ldots, s_{n-K})'$ will be 0 (because "0" occurs more often than "1" in these measurement results).

Curve 404 illustrates the performance of a comparable embodiment of method 300. Better performance of method 300 in at least a range of input-error probability values is evident in FIG. 4 from the corresponding lower rates of failure than the rates of failure exhibited by the replica method.

According to an example embodiment disclosed above, e.g., in the summary section and/or in reference to any one or any combination of some or all of FIGS. 1-4, provided is an apparatus comprising: a register (e.g., 134, FIG. 1) configured to store a coded entangled qubit state generated using a quantum stabilizer code; a measurement circuit (e.g., 140, FIGS. 1, 2A) configured to perform a redundant measurement of a set of syndrome values corresponding to the coded entangled qubit state, the redundant measurement being performed based on an error-correction code defined using an ordered set of generator vectors (e.g., $g_i$, where i=1, 2, . . . , n–K, Eq. (1)) of the quantum stabilizer code and a plurality of different linear combinations (e.g., $f_q$, where q=1, 2, . . . , N, Eq. (4)) of the generator vectors; and an electronic decoder (e.g., 144, FIG. 1) configured to use the error-correction code to correct a measurement error in the set of syndrome values; and wherein a generator matrix (e.g., G(Q), Eq. (1)) defined by the ordered set of generator vectors has a first inclined-stripe form (e.g., in accordance with Eqs. (2), (9)).

In some embodiments of the above apparatus, the generator matrix is self-orthogonal (e.g., in accordance with Eq. (3)).

In some embodiments of any of the above apparatus, a supplemental parity-check matrix (e.g., A, Eq. (5)) defined by coefficients (e.g., $a_{iq}$, Eq. (4)) used in the different linear combinations has a second inclined-stripe form (e.g., in accordance with Eq. (12)).

In some embodiments of any of the above apparatus, the second inclined-stripe form is a transposed form with respect to the first inclined-stripe form.

In some embodiments of any of the above apparatus, each of the coefficients has one of two binary values (e.g., $a_{iq} \in \{0,1\}$, Eq. (4)).

In some embodiments of any of the above apparatus, the second inclined-stripe form is constructed by incrementally shifting down a continuous subset (e.g., $a_0$, Eqs. (7)-(8)) of topmost matrix elements of a leftmost column of the supplemental parity-check matrix.

In some embodiments of any of the above apparatus, the generator matrix is a matrix over a Galois field.

In some embodiments of any of the above apparatus, the generator matrix is a matrix over a Galois field of size 4 (e.g., GF(4), Eq. (2)).

In some embodiments of any of the above apparatus, the first inclined-stripe form is constructed by incrementally shifting right a continuous sub-block (e.g., $[G_1 \ldots G_v]$, Eq. (2)) of leftmost matrix elements of a topmost row block of the generator matrix.

In some embodiments of any of the above apparatus, the electronic decoder is configured to correct the measurement error based on trellis-type decoding (e.g., 306, FIG. 3).

In some embodiments of any of the above apparatus, the apparatus further comprises a state-recovery circuit (e.g., 148, FIG. 1) configured to correct a degradation error in the coded entangled qubit state based on the set of syndrome values (e.g., $(s_1, \ldots, s_{n-K})'$ determined at 306, FIG. 3) received from the electronic decoder.

In some embodiments of any of the above apparatus, the state-recovery circuit is further configured to: determine, based on the set of syndrome values received from the electronic decoder, an error operator corresponding to a most-probable error in the coded entangled qubit state; and subject the coded entangled qubit state to a stimulus (e.g., 150, FIG. 1) determined based on the error operator.

In some embodiments of any of the above apparatus, the apparatus further comprises an array (e.g., 110, FIG. 1) for storing a plurality of coded entangled qubit states, wherein the apparatus is configured to: transfer (e.g., 302, FIG. 3) a selected coded entangled qubit state from the array to the register; and transfer (e.g., 312, FIG. 3) the selected coded entangled qubit state from the register to the array after the degradation error is corrected.

In some embodiments of any of the above apparatus, the measurement circuit comprises: a set of first measurement modules (e.g., 210, FIG. 2A) coupled to the register, each of the first measurement modules being configured to measure a respective syndrome value of the coded entangled qubit state based on a respective one of the generator vectors; a set of second measurement modules (e.g., 220, FIG. 2A) coupled to the register, each of the second measurement modules being configured to measure a respective parity value corresponding to the syndrome of the coded entangled qubit state based on a respective one of the different linear combinations of the generator vectors.

In some embodiments of any of the above apparatus, a measurement module in the measurement circuit comprises: a plurality of quantum gates connected to the register and configured to process a reference multi-qubit state (e.g., ancilla qubits, FIGS. 2B, 2C) by coupling a subset of qubits of the coded entangled qubit state to said reference multi-qubit state; and a logic circuit (e.g., 212, FIGS. 2B, 2C) configured to estimate a syndrome value or a parity value of the coded entangled qubit state from measurements on the processed reference multi-qubit state performed using the quantum gates.

While this disclosure includes references to illustrative embodiments, this specification is not intended to be construed in a limiting sense.

In some embodiments, Galois fields of other sizes may also be used.

Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An apparatus comprising:
a register configured to store a coded entangled qubit state encoded using a quantum stabilizer code;
a measurement circuit configured to perform a redundant measurement of a set of syndrome values corresponding to the coded entangled qubit state to generate a measurement vector having the set of syndrome vlaues and a set of parity values, the redundant measurement being performed based on a convolutinal error-correction code defined using an ordered set of generator vectors of the quantum stabilizer code and a plurality of linearly independent combinations of the generator vectors; and
an electronic decoder configured to use the convolutional error-correction code to correct a measurement error in the set of syndrome values in the measurement vector on which the redundant measurement has been performed; and
wherein:
the ordered set of generator vectors are defined by coefficients in a generator matrix having a first inclined-stripe form; and
the plurality of linearly independent combinations of the generator vectors are defined by coefficients in a supplemented parity-check matrix having a second inclinded-stripe form.

2. The apparatus of claim 1, wherein the second inclined-stripe form is a transposed form with respect to the first inclined-stripe form.

3. The apparatus of claim 1. wherein each of the coefficients in the supplemental parity-check matrix has one of two binary values.

4. The apparatus of claim 1, wherein the second inclined-stripe form is constructed by incrementally shifting down a continuous subset of topmost matrix elements of a leftmost column of the supplemental parity-check matrix.

5. The apparatus of claim 1, wherein the generator matrix is a matrix over a Galois field.

6. The apparatus of claim 1, wherein the generator matrix is a matrix over a Galois field of size 4.

7. The apparatus of claim 1, wherein the first inclined-stripe form is constructed by incrementally shifting right a continuous sub-block of leftmost matrix elements of a topmost row block of the generator matrix.

8. The apparatus of claim 1, wherein the electronic decoder is configured to correct the measurement error based on trellis-type decoding.

9. The apparatus of claim 1, further comprising a state-recovery circuit configured to correct a degradation error in the coded entangled qubit state based on the set of syndrome values received from the electronic decoder.

10. The apparatus of claim 9, wherein the state-recovery circuit is further configured to:
determine, based on the set of syndrome values received from the electronic decoder, an error operator corresponding to a most-probable error in the coded entangled qubit state; and
subject the coded entangled qubit state to a stimulus determined based on the error operator.

11. The apparatus of claim 9, further comprising an array for storing a plurality of coded entangled qubit states, wherein the apparatus is configured to:
transfer a selected coded entangled qubit state from the array to the register; and
transfer the selected coded entangled qubit state from the register to the array after the degradation error is corrected.

12. The apparatus of claim 1, wherein the measurement circuit comprises:
a set of first measurement modules coupled to the register, each of the first measurement modules being configured to measure a respective syndrome value of the coded entangled qubit state based on a respective one of the generator vectors;
a set of second measurement modules coupled to the register, each of the second measurement modules being configured to measure a respective parity value corresponding to the syndrome of the coded entangled qubit state based on a respective one of the linearly independent combinations of the generator vectors.

13. The apparatus of claim 1, wherein a measurement module in the measurement circuit comprises:
a plurality of quantum gates connected to the register and configured to process a reference multi-qubit state by coupling a subset of qubits of the coded entangled qubit state to said reference multi-qubit state; and
a logic circuit configured to estimate a syndrome value or a parity value of the coded entangled qubit state from measurements on the processed reference multi-qubit state performed using the quantum gates.

* * * * *